United States Patent [19]
Koo

[11] 3,978,459
[45] Aug. 31, 1976

[54] HIGH DENSITY MOS MEMORY ARRAY

[75] Inventor: James T. Koo, Sunnyvale, Calif.

[73] Assignee: Intel Corporation, Santa Clara, Calif.

[22] Filed: Apr. 21, 1975

[21] Appl. No.: 569,927

[52] U.S. Cl. .................. 340/173 R; 340/173 FF; 307/238
[51] Int. Cl.² .......................................... G11C 11/40
[58] Field of Search... 340/173 R, 173 AM, 173 FF, 340/173 CP; 307/238, 279

[56] References Cited
UNITED STATES PATENTS 3,769,621  10/1973  Osborne ..................... 340/172.5
3,806,898  4/1974  Askin ......................... 340/173 CP Primary Examiner—Terrell W. Fears
Attorney, Agent, or Firm—Spensley, Horn, & Lubitz

[57] ABSTRACT

A high density MOS integrated circuit memory array utilizing single device dynamic cells and a uniquely controlled sense amplifier. The loads of the sense amplifier are also used to precharge bit lines thereby reducing the number of devices used in prior art arrays. A single noise suppression circuit provides planar noise suppression, the circuit is clocked with the same signals used to control the sense amplifier.

15 Claims, 3 Drawing Figures

HIGH DENSITY MOS MEMORY ARRAY

BACKGROUND OF THE INVENTION

1. Field of the Invention

The invention relates to the field of high density MOS memory arrays.

2. Prior Art

It is generally recognized in the fabrication of integrated circuit MOS memories that yields are not substantially affected by device densities. Thus, one method of producing more economical memories is to increase device density such that for a given size substrate more storage is provided. However, certain prior art circuits and designs require substantial substrate area, and do not lend themselves to high density memory arrays.

In the prior art, particularly in dynamic random-access memories (RAMs), sense amplifiers disposed along each bit line in an array are commonly utilized. Often these sense amplifiers comprise bistable circuits which couple the bit sense line to a source of potential (power supply) through load transistors. Also in these memories pull-up transistors or networks are used to precharge the bit sense lines during a read cycle. By way of example, using prior art circuits in a 16K array having 128 bit sense lines bisected by a sense amplifier, 260 relatively large devices are required to pull-up or precharge the bit sense lines. As will be seen, the present invention eliminates the pull-up transistors and precharges the bit sense lines through the load transistors of the sense amplifiers.

Noise suppression techniques are known in the prior art for suppressing noise on word lines in a memory array. For example, latch circuits are used on word lines to suppress noise. In "An 8k b Random-Access Memory Chip Using the One-Device FET Cell", by Hoffman and Kalter, *The Journal of Solid-State Circuits*, Vol. SC-8, No. 5, October 1973, at page 301, a three-device latch circuit is shown for use on each half word line in an array. Again a large number of devices are required to provide noise suppression, hence limiting the number of bits of storage possible for a given substrate area. As will be seen, the present invention provides noise suppression for the entire array with two devices.

SUMMARY OF THE INVENTION

An MOS dynamic random-access memory employing a plurality of sense lines coupled to a plurality of sense amplifiers is disclosed. At least one transistor in each of the sense amplifiers is coupled between a source of potential and a sense line. A signal generator means coupled to each of the sense amplifiers is used for causing the transistor of each of the sense amplifiers to sequentially charge the sense lines, and also to operate as a load for the amplifier. Thus, a single transistor performs a precharging function in addition to acting as a load to the sense amplifier.

DETAILED DESCRIPTION OF THE INVENTION

Figure 1:
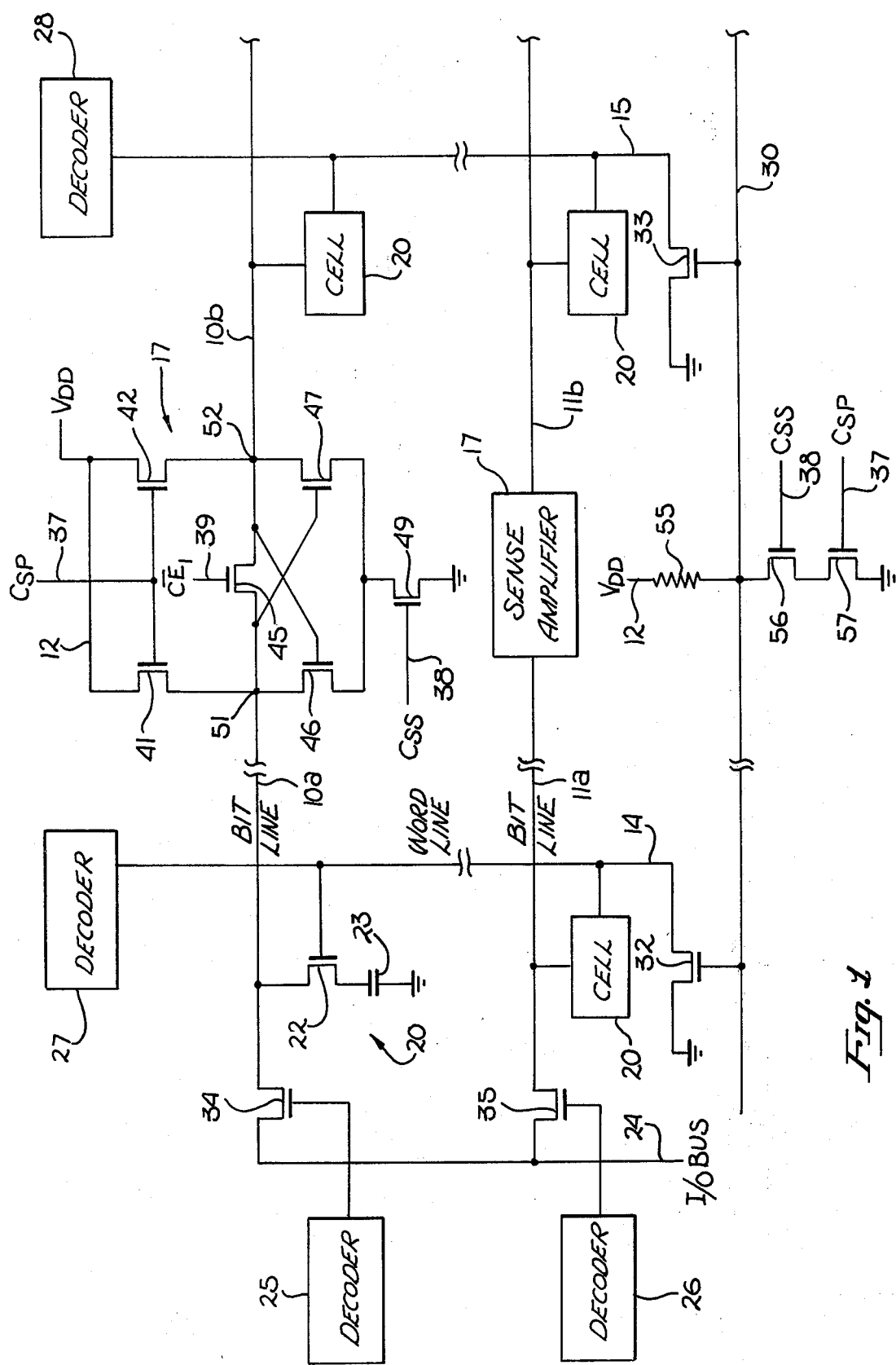
FIG. 1 is a partial circuit diagram showing the general layout of the presently preferred embodiment of the invention including a single sense amplifier and the noise suppression circuit used for suppressing noise on the word lines in the memory array.

An integrated circuit MOS dynamic random-access memory (RAM) is described. In the presently preferred embodiment a 16k memory is fabricated on a single p-type silicon substrate utilizing n-channel field-effect transistors (enhancement mode) and polycrystalline silicon gates. As will be appreciated, the specific details disclosed in this application, such as substrate conductivity type, specific number of cells, and other details, are not critical to the invention, however they are described to give a better understanding of the invention.

The disclosed random-access memory receives input power identified as $V_{DD}$, line 12, this being a positive potential in the presently preferred embodiment where n-channel devices are employed. A ground line or ground is illustrated in the drawings but as will be appreciated, the potential of this ground line or return line need not be zero volts. Moreover, as is often the case, the memory employs substrate biasing which is not illustrated.

In FIG. 1 a partial section of the memory array is illustrated, and includes a single input-output bus 24 which communicates with the bit lines or bit sense lines in the arrays. Two such bit lines are illustrated, line 10a and 10b, and line 11a and 11b. Each of the bit lines is substantially bisected by a sense amplifier 17. In the entire 16k memory 256 such bit lines are used, each bisected by a sense amplifier 17. The bit lines communicate with the input-output buses through selection transistors, these transistors being activated by decoders. For example, line 10 is coupled to the input-output bus 24 through transistor 34, this transistor having its gate coupled to decoder 25. Similarly, bit line 11a is coupled to the input-output bus 24 through transistor 35, this transistor being coupled to decoder 26.

Not shown in FIG. 1 are the input-output buffers, including the address buffers, data-in buffer, data-out buffer, chip-enable timing signal buffers ($CE_1$ and $CE_2$) and other circuits known in the prior art in order not to overcomplicate the drawings. Prior art circuits may be utilized to perform these functions and other functions not specifically shown, such as the decoding function.

In the presently preferred embodiment each memory cell comprises a single device cell, which stores information in the form of a charge on a capacitance. Each cell 20 is coupled to a bit line in the array and also to a word line in the array. One such cell 20 is illustrated coupled to word line 14 and bit line 10a and includes a transistor 22 and a capacitor 23. Such cells and their method of fabrication are known in the prior art and such prior art technology may be employed.

Two word lines, lines 14 and 15, are illustrated, word line 14 being coupled to and activated by decoder 27; and word line 15 being coupled to and activated by decoder 28. In the 16k memory 130 such word lines are employed, half being disposed on each side of the sense amplifiers 17.

Each sense amplifier 17 substantially bisects each of the bit lines in the array such that half the cells are disposed to the right of the column of sense amplifiers, and the other half of the cells to the left of the sense amplifiers. Since a single input-output bus 24 is employed, data is written into and read from the cells on the right portion of the array through the sense amplifiers. The sense amplifiers 17 are generally bistable circuits, and thus a binary "1" placed on a bit line on the left portion of the array, after passing through a sense amplifier, is stored as a binary "0" on the right portion of the array. However, when this binary signal is read from a cell on the right portion of the array it is again inverted as it passes through sense amplifier 17 and is read from the memory as a binary "1".

Each sense amplifier 17 includes a pair of cross-coupled branches, each of which is coupled to a half a bit line. Specifically, transistors 41 and 46 are coupled in series between the potential $V_{DD}$, line 12, and the drain of transistor 49. Similarly, transistors 42 and 47 are coupled in series between line 12 and the drain of transistor 49. The common junction between transistors 41 and 46, node 51, is coupled to line 10a and also to the gate of transistor 47. The common node 52 between transistors 42 and 47 is coupled to line 10b and also to the gate of transistor 46. The source terminals of transistors 46 and 47 are coupled to ground through transistor 49. the gate of transistor 49 is coupled to line 38, the source of the $C_{SS}$ signal. Equalizing transistor 45 interconnects lines 10a and 10b during "dead time". The gate of transistor 45 is coupled to line 39, the source of the $\overline{CE_1}$ signal. The gates of transistors 41 and 42 are coupled to line 37, the source of the $C_{SP}$ signal; the generation of this signal shall be discussed in conjunction with FIG. 2. As will be seen, transistors 41 and 42, in addition to acting as loads for sense amplifier 17, also are used for precharging lines 10a and 10b.

Each of the word lines in the array is coupled to ground through a transistor. For example, line 14 is coupled to ground through transistor 32, and line 15 is coupled to ground through transistor 33. The gate of transistors 32 and 33 and the gates of the other transistors coupling the other word lines to ground, are coupled to a common line 30. Line 30 is coupled to ground through transistors 56 and 57, and the the $V_{DD}$ potential, line 12, through resistor 44. The gate of transistor 56 is coupled to line 38, and the gate of transistor 57 is coupled to line 37. Hence, line 30 is coupled to ground only when the $C_{SS}$ and $C_{SP}$ signals are positive. As will be discussed, this circuit is utilized for suppressing noise associated with the word lines in the array.

Before examining the $C_{SP}$ generator of FIG. 2, a brief explanation of the externally applied signals and internally generated signals, particularly clocking signals, as used in the presently preferred embodiment, will be given. It will be appreciated that the memory may be implemented with other timing signals and utilizing other logic schemes. The memory receives two externally generated chip enable pulses identified as $CE_1$ and $CE_2$. The $CE_1$ signal is the main chip enable pulse and indicates that information is to be read from or written into the array so that the memory is to be refreshed. A $CE_2$ signal, which is externally generated, is applied to the memory when the second group or final group of address bits have been received by the memory. When reading information from the array or writing information into the array the $CE_2$ pulse follows the $CE_1$ pulse. However, for refreshing the array the $CE_2$ pulse is first applied to the memory followed by the $CE_1$ pulse. The memory also receives a read/write signal indicating whether the information is to be read from the memory or written into the memory and, of course, a data signal.

The memory generates a strobe sense signal identified as $C_{SS}$ (line 38) at the start of each read/write signal. This signal is generated from the $CE_1$ signal, its waveform is shown as signal 86 in FIG. 3. This signal may be generated from ordinary circuit means. The memory also generates a $C_W$ signal or write signal. This signal is generated after the $CE_2$ signal is received provided that information is to be written into the memory. The memory also generates a bit strobe signal identified as $C_{BS}$ after receipt of the $CE_2$ signal both during a read and write cycle. However, as will be explained, this signal insofar as the generation of the $C_{SP}$ signal is concerned, is marked by the $C_W$ signal when the latter signal is present. This occurs in part since the duration of the $C_{BS}$ signal is approximately half the duration of the $C_W$ signal.

The memory also generates two signals used for refresh, $CWS_1$ and $CWS_2$ from the $CE_1$ signal. These refresh signals are used to select a row in the array for refreshing. Following the generation of the $CWS_1$ and $CWS_2$ signals a $C_{SS}$ signal is generated, and then the $C_{SP}$ signal becomes positive allowing refreshing to occur.

Figure 2:
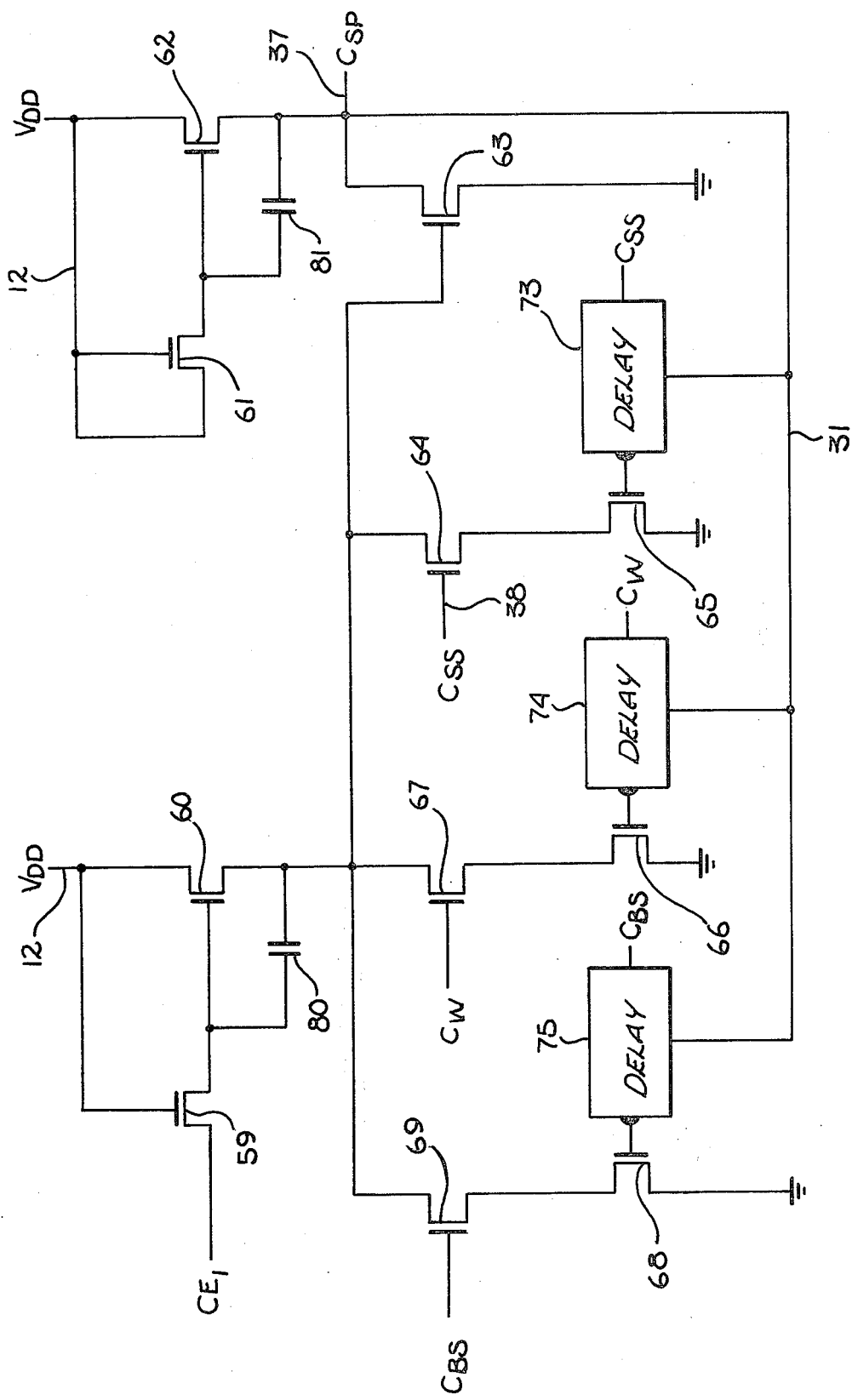
FIG. 2 is a circuit diagram of a generator used for generating a control signal for the sense amplifiers of FIG. 1 and also for the noise suppression circuit of FIG. 1.

The input signals to the generator of FIG. 2 are the $C_{SS}$ signal, $C_W$ signal and $C_{BS}$ signal, in addition to the $CE_1$ signal. The output, line 37, is coupled between an output or pull-up transistor 62 and a pull-down transistor 63. Transistor 62 has its drain coupled to line 12 and its source coupled to line 37 and one terminal of capacitor 81. The other terminal of capacitor 81 is coupled to the gate of transistor 62 and to one terminal of transistor 61. The other terminal of transistor 61 and the gate of transistor 61 are coupled to line 12. Transistor 61 and capacitor 81 are used for bootstrapping the gate of transistor 62; capacitor 81 is charged through a path which includes pull-down transistor 63.

The gate of transistor 63 is coupled to a bootstrap circuit which includes transistors 59 and 69 and capacitor 80. Transistor 60 is coupled between line 12 and the gate of transistor 63, the source of transistor 60 is coupled through capacitor 80 to the gate of transistor 60 and one terminal of transistor 59. The other terminal of transistor 59 is coupled to the source of the $CE_1$ signal, the gate of transistor 59 is coupled to line 12. As is apparent transistor 63 only conducts when the $CE_1$ signal is present.

The gate of transistor 63 is coupled to three other networks, the first of which includes transistors 64 and 65 coupled in series between the gate of transistor 63 and ground. The gate of transistor 64 is coupled to line 38, the source of the $C_{SS}$ signal; the gate of transistor 65 is coupled to a delay circuit 73. The delay circuit 73 receives the $C_{SS}$ signal, also the delay circuit 73 is coupled to feedback line 31, and hence receives the $C_{SP}$ signal. The $C_{SP}$ signal and $C_{SS}$ signal (within delay circuit 73) are applied to an AND gate, the output of which is delayed, inverted and then applied to the gate of transistor 65. Any one of numerous delay networks may be utilized for circuit 73.

The gate of transistor 63 is also coupled to ground through the series combination of transistors 66 and 67. The gate of transistor 67 is coupled to the source of the $C_W$ signal; the gate of transistor 66 is coupled to a delay circuit 74. The delay circuit 74 receives two inputs, the $C_{SP}$ and $C_W$ signals. Delay circuit 74 may be the same general circuit as circuit 73 and includes an AND gate having as its inputs the $C_W$ and $C_{SP}$ signals and an inverted, delayed output applied to the gate of transistor 66.

The gate of transistor 63 is also coupled to ground through the series combination of transistors 69 and 68. The gate of transistor 69 is coupled to the source of the $C_{BS}$ signal, the gate of transistor 68 is coupled to delay circuit 75. Delay circuit 75 may be similar to delay circuits 73 and 74 and includes as inputs the $C_{BS}$ signal and the $C_{SP}$ signal.

Figure 3:
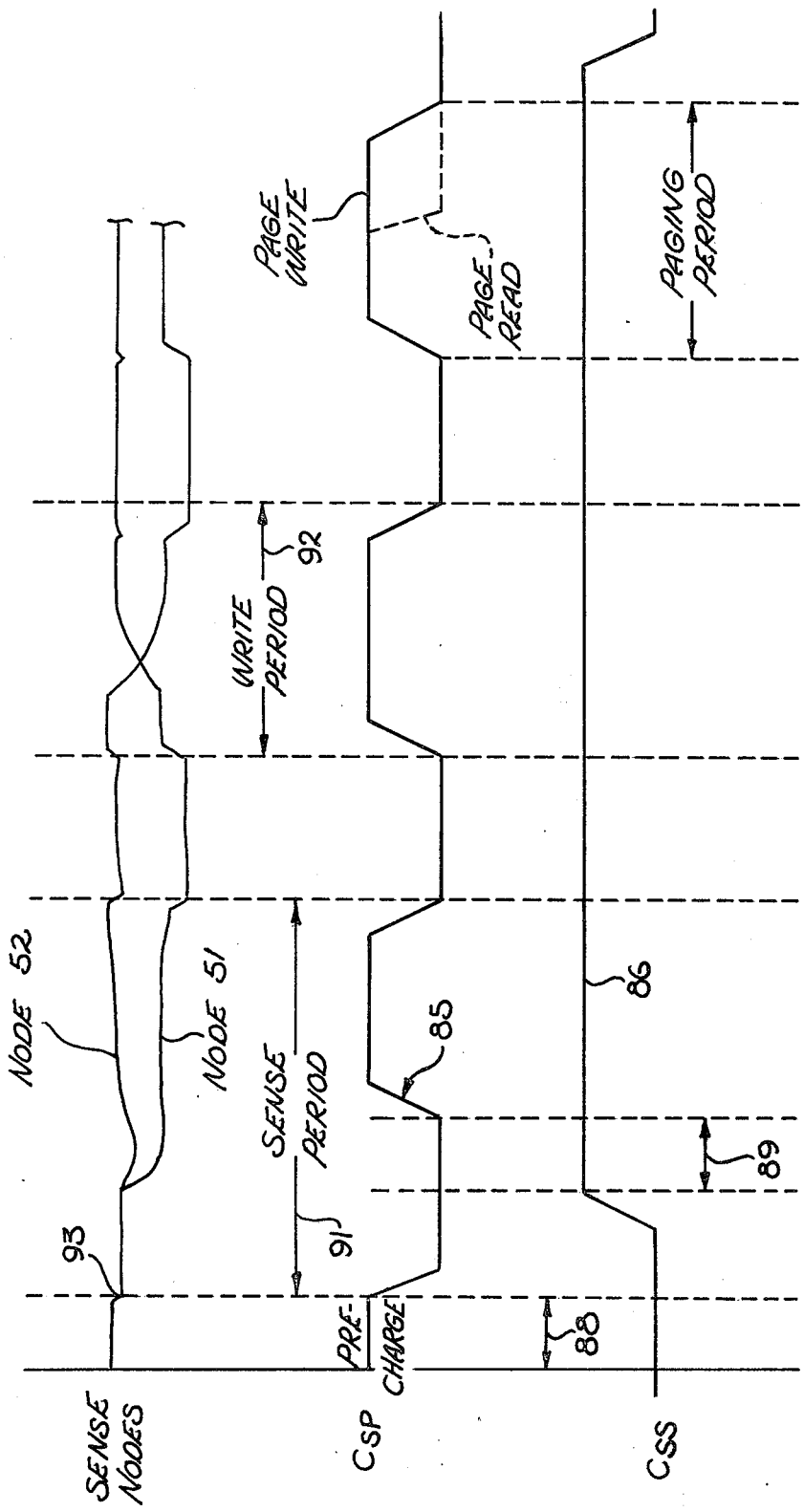
FIG. 3 is a graph illustrating various waveforms associated with the sense amplifier of FIG. 1 and the generator of FIG. 2.

The operation of the sense amplifier 17 will be explained in conjunction with the operation of the generator shown in FIG. 2. Prior to the time that the chip is enabled, that is during "dead time", line 39, which includes the gate of transistor 45, (FIG. 1) will be positive, and hence node 51 and 52 and lines 10a and 10b will be connected. Also during dead time since the $CE_1$ signal is not present, the pull-down transistor 63 of FIG. 2 is not conducting. Hence, line 37 is at a positive potential since transistor 62 is conducting. In FIG. 3 a portion of this period is shown as period 88. During period 88 as indicated, the $C_{SS}$ signal (signal 86 of FIG. 3) is at its low state while the $C_{SP}$ signal (signal 85 of FIG. 3) is positive. Since the $C_{SP}$ signal is positive transistors 41 and 42 of the sense amplifier 17 (FIG. 1) are conducting, and thus lines 10a and 10b are charged from line 12., and also since transistor 45 is conducting the potential on these two lines is equalized. Therefore, during "dead time" the load transistors of all the sense amplifiers 17 in the array are charging the bit lines in the array.

When the chip is enabled and the $CE_1$ signal is received, transistor 59 of FIG. 2 conducts causing transistor 63 to conduct; this in turn causes the $C_{SP}$ signal to decay to ground potential. Lines 10a and 10b of FIG. 1 then float since transistors 41 and 42 cease to conduct. The transient on node 51 and 52 caused by the switching of transistors 41 and 42 is shown in the uppermost waveform of FIG. 3 at point 93. Following the receipt of the $CE_1$ signal by the memory the $C_{SS}$ signal is generated causing transistor 49 of FIG. 1 to conduct. This effectively activates the sense amplifier 17, however, since transistors 41 and 42 are not conducting the loads in both branches of this bistable circuit are effectively infinite. This duration of time is shown as period 89 in FIG. 3. The $C_{SS}$ signal when applied to the gate of transistor 64 (FIG. 2) activates transistor 64 and brings the gate of transistor 63 down to ground through transistor 65. (Note that the output from the delay circuit 73 is normally positive.) The period 89 is shown in somewhat enlarged form in FIG. 3 and results from the time required for the potential on the gate of transistor 63 to be discharged. When the gate of transistor 63 is discharged line 37, the $C_{SP}$ signal, again becomes positive activating the load transistors 41 and 42 of the sense amplifier of FIG. 1.

At approximately the time that the $C_{SS}$ signal becomes positive the memory has received and decodes the first group of address signals, corresponding to the selected word line and selected the word line. Assume for the sake of discussion that line 10a of FIG. 1 drops in potential when a word line is selected. In FIG. 3 the potential on node 51 is illustrated along with the potential on node 52 for this condition. When the $C_{SS}$ signal becomes positive the potential on node 51 drops, while the potential on node 52 decays only slightly, and then returns to its initial value, since for the given example transistor 46 is conducting and transistor 47 is off. Thus, node 52 recharges through transistor 42 while node 51 is unable to recharge since transistor 46 is conducting. During the sense period 91 shown in FIG. 3, the sense amplifier 17 determines the state of lines 10a and 10b and the bistable circuit of the sense amplifier 17 is set in one of its two stable states. Note that during period 89 the amplifier has extremely high gain since the loads are the nonconducting transistors 41 and 42.

Referring to FIG. 2, after the $C_{SS}$ signal has been delayed by delay circuit 73, the gate of transistor 65 drops in potential causing transistor 65 to cease conducting, thus allowing transistor 63 to conduct. When this occurs the $C_{SP}$ signal drops to its low state as indicated in FIG. 3 at the end of the sense period 91. Thus, the delay associated with the delay circuit 73 of FIG. 2 must be sufficient in duration to allow the sense amplifier to sense the state of the bit lines. Note that in the array all the sense amplifiers sense their respective bit lines, simultaneously, and hence all sense amplifiers 17 will be set in one state or the other at the end of sense period 91. At the end of the sense period 91 the state of the bit lines may be sensed at the input-output bus 24. This will be discussed in more detail in connection with the page reading and page writing modes.

Assume next that information is to be written into a cell in the array. For the sake of explanation assume that a charge is to be placed on capacitor 23 of FIG. 1. This requires the activation of transistor 34 by decoder 25, and transistor 22 by decoder 27. When the $C_W$ signal is generated transistor 67 conducts causing the $C_{SP}$ signal to rise in potential, since transistor 63 is no longer conducting. Note again that transistor 66 conducts until such time as the $C_W$ signal (after inversion) reaches the gate of transistor 66 through the delay circuit 74. When the inverted $C_W$ signal reaches the gate of transistor 66 the write cycle ends, and the $C_{SP}$ signal decays. In FIG. 3 the rise decay of the $C_{SP}$ signal during the write cycle is shown as the write period 92. Referring to FIG. 1, charge placed on the input-output bus 24 during the write period overrides the previous state of the sense amplifier 17 and causes node 51 to charge. This in turn causes transistor 47 to conduct and line 10b to discharge. The waveforms for this charging and discharging is shown in the uppermost waveforms of FIG. 3 during the write period 92. Period 92 is long enough in duration to allow programming of a cell. During this period if a $C_{BS}$ signal is generated, the effect of this latter signal on the $C_{SP}$ signal is masked, and thus does not interfere with the $C_{SP}$ signal shown during the write period 92.

The memory, in addition to manual reading, writing and refreshing modes, by the selection of a single cell in the array, operates in page-read and page-write modes. During page-read the state of the cells disposed along a single word line, such as word line 14 of FIG. 1, are simultaneously sensed by the sense amplifiers 17 and the state of these cells is stored within the sense amplifiers 17. Then each of the bit lines are sensed by sequentially coupling each of the bit lines to the input-output bus 24. For example, decoder 25 would activate transistor 34 and couple bit line 10a to the input-output 24 and so on, until each of the bit lines are coupled one at a time to the input-output bus 24.

The page-write operation proceeds in a similar fashion, that is a single word line in the array is selected, and then each of the bit line decoders (one at a time) select a bit line coupling it to the input-output bus so that each cell along the selected word line may be sequentially programmed.

The page-read cycle is commenced after the sense period 91, since during this period the state of each cell along the selected word line is sensed and stored in the sense amplifiers. The $C_{BS}$ signal, when applied to transistor 69 (FIG. 2) causes the $C_{SP}$ signal to rise in potential as indicated during the paging period 90. After the $C_{BS}$ signal is delayed and inverted through delay circuit 75, transistor 68 ceases to conduct and transistor 63 conducts, thereby pulling down the $C_{SP}$ signal. This is indicated in FIG. 3 in dotted lines as the page-read signal. During page-write, since the $C_W$ signal is present, and longer in duration than the $C_{BS}$ signal, the gate of transistor 63 remains coupled to ground through transistors 66 and 67, and hence the effect of the $C_{BS}$ signal on the $C_{SP}$ signal is masked. The page-write waveform is indicated during the paging period.

Referring now to FIG. 1, the noise suppression circuit which includes transistors 32, 33, 56 and 57, resistor 55 and line 30, effectively clamp all the word lines in the array to ground except for that period when the $C_{SS}$ signal and $C_{SP}$ signals are both positive. The devices that clamp the word lines to ground, such as transistors 32 and 33, are small devices, that is they have a relatively high resistance. Thus, when a particular word line is selected, the decoder tends to overpower these transistors. By way of example, assume that word line 14 is selected by decoder 27 during the period 89 shown in FIG. 3, node 51 begins to drop in potential even though transistor 32 is coupling line 14 to ground. Once the $C_{SP}$ signal becomes positive, assuming of course that the $C_{SS}$ signal is already positive, line 30 is clamped to ground allowing all the word lines in the array to float.

With the above described sense amplifier and $C_{SP}$ signal it has been found that increased sensitivity is obtained, reduced power consumption occurs and when the $C_{SP}$ signal is in its low state information is stored despite the fact that no power is consumed.

Thus, a memory array has been disclosed wherein the load devices of the sense amplifier are utilized both as loads in the sense amplifier and also for precharging bit lines in the array. A single generator is utilized for generating a waveform which activates all the loads in all the sense amplifiers of the array, simultaneously. The output from this generator is also utilized in a noise suppression circuit for suppressing noise along the word lines in the array.

I claim:

1. In an MOS dynamic RAM employing a plurality of sense lines coupled to a plurality of sense amplifiers an improvement comprising:
   at least a first transistor in each of said sense amplifiers, coupled between a source of potential and said sense line; and
   signal generation means coupled to said sense amplifiers for causing said first transistor in each of said sense amplifiers to sequentially charge said sense line and operate as a load in said sense amplifier; whereby a single transistor performs both a precharging function and operate as a load in the sense amplifier.

2. The improvement defined by claim 1 wherein said signal generation means includes a plurality of delay circuits.

3. The improvement defined by claim 2 wherein said sense amplifier includes a second transistor, coupled to said first transistor which selectively couples said first transistor such that current flows through said first and second transistors from said source of potential.

4. The improvement defined by claim 3 wherein said second transistor is controlled by a control signal, and wherein said control signal is applied to one of said delay circuits of said signal generation means.

5. The improvement defined by claim 4 wherein said first and second transistors comprise n-channel devices.

6. the improvement defined by claim 5 wherein said first and second transistors and said signal generation means are fabricated on a common substrate.

7. In an MOS dynamic memory employing a plurality of sense lines coupled to a plurality of sense amplifiers wherein each of said sense amplifiers include a bistable circuit having a first and a second load transistor each coupled between a source of potential and one of such sense lines, an improvement comprising:
   control means coupled to such sense amplifiers for causing such first and second transistors to selectively charge such sense lines and alternately to operate as loads in such sense amplifiers.

8. The improvement defined by claim 7 including a third transistor in such sense amplifiers for selectively permitting current to flow in such sense amplifiers from said source of potential thereby activating such amplifiers.

9. The improvement defined by claim 8 wherein said control means causes said third transistor to conduct prior to the time that such first and second transistors conduct such that the loads in such sense amplifiers are the nonconducting impedence of such first and second transistors.

10. The improvement defined by claim 9 wherein said control means includes a plurality of delay circuits.

11. The improvement defined by claim 10 wherein such memory, such first and second transistors, said third transistor and said control means employ n-channel transistors which are disposed on a common p-type silicon substrate.

12. The improvement defined by claim 8 wherein such memory includes a plurality of word lines and wherein said word lines are selectively clamped to a second potential through a circuit means, said circuit means being coupled to said control means.

13. The improvement defined by claim 12 wherein said word lines are decoupled from said second potential when such first and second transistors and said third transistor conduct.

14. The improvement defined by claim 13 wherein said second potential is the potential of the memory ground.

15. In an MOS memory employing a plurality of sense amplifiers and a plurality of word lines, an improvement for suppressing noise in such memory comprising:
   circuit means for selectively coupling such word lines in such memory to a common potential and for decoupling such word lines in such memory from said common potential when such sense amplifiers are activated; and
   control means for generating a control signal for controlling said circuit means, coupled to said circuit means;
   whereby said circuit means suppresses noise in such memory associated with, or transmitted by, such word lines.

* * * * *